(12) United States Patent
de Jonge et al.

(10) Patent No.: US 7,288,773 B2
(45) Date of Patent: Oct. 30, 2007

(54) ELECTRON SOURCE, AND CHARGED-PARTICLE APPARATUS COMPRISING SUCH AN ELECTRON SOURCE

(75) Inventors: Niels de Jonge, Eindhoven (NL); Erik Petrus Antonius Maria Bakkers, Eindhoven (NL); Louis Felix Feiner, Eindhoven (NL); Antonio Maria Calvosa, Milan (IT)

(73) Assignees: FEI Company, Hillsboro, OR (US); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/233,488

(22) Filed: Sep. 22, 2005

(65) Prior Publication Data

US 2006/0076504 A1   Apr. 13, 2006

(30) Foreign Application Priority Data

Sep. 24, 2004   (EP) ................................. 04077645

(51) Int. Cl.
*H01J 37/73*   (2006.01)
(52) U.S. Cl. .................... 250/423 F; 250/311
(58) Field of Classification Search ........... 250/423 F, 250/423 P, 427, 311, 310; 257/11, 30
See application file for complete search history.

(56) References Cited

U.S. PATENT DOCUMENTS 3,699,404 A * 10/1972 Simon et al. ............... 257/11
3,872,489 A *  3/1975 Hagenlocher ............... 257/11

OTHER PUBLICATIONS

X. Duan; Indium Phosphide Nanowires as Building Blocks for Nanoscale Electronic and Optoelectronic Devices; Nature (2001); vol. 409; pp. 66-69.
Yenilmez et al.; "Wafer Scale Production of Carbon Nanotubes Scanning Probe Tips for Atomic Force Microscopy"; Applied Physics Letters (2002); vol. 80, No. 12: pp. 2225-2227.

* cited by examiner

*Primary Examiner*—Kiet T. Nguyen
(74) *Attorney, Agent, or Firm*—Scheinberg & Griner, LLP; Michael O. Scheinberg

(57) ABSTRACT

The invention provides an electron source suitable for use in a charged-particle apparatus, in which source a beam of electrons can be extracted from an electrode that is subjected to at least one of an electric potential, thermal excitation and photonic excitation, whereby at least part of the electrode comprises semiconductor material having a conduction band that is quantized into discrete energy levels. Such a source enjoys a relatively low energy spread, typically much smaller than that of a Cold Field Emission Gun (CFEG). The semiconductor material may, for example, comprise a semiconductor nanowire including InAs and GaInAs.

24 Claims, 6 Drawing Sheets

ELECTRON SOURCE, AND CHARGED-PARTICLE APPARATUS COMPRISING SUCH AN ELECTRON SOURCE

The invention relates to an electron source suitable for use in a charged-particle apparatus, in which source a beam of electrons can be extracted from an electrode that is subjected to at least one of an electric potential, thermal excitation and photonic excitation.

The invention also relates to a particle-optical apparatus comprising an electron source, a holder for an object, and means for directing an electron beam from the electron source onto the object.

Electron sources are conventionally employed in various types of charged-particle apparatus, such as electron microscopes, electron-beam lithographic apparatus (either direct-write or projection-type), (medical) diagnostic apparatus, electron-assisted deposition apparatus, etc. Depending on the application involved, the source will generally be required to meet certain desired specifications, e.g. regarding flux intensity, emission stability, beam directionality, electron energy and energy spread (chromaticity). With regard to chromaticity, and in the particular case of electron microscopy, for example, the energy resolution of energy-resolved spectroscopy in both a scanning electron microscope (SEM) and a transmission electron microscope (TEM), as well as the spatial resolution, will be limited by the energy spread of the employed electron source. Similarly, in an electron-beam lithography tool, excessive chromaticity will substantially limit the minimum line width that can be satisfactorily imaged/written on a semiconductor substrate.

In the case of a conventional source employing a Schottky emitter (i.e. a thermally-assisted field emission source), the energy spread $\delta E$ is typically about 0.8 eV. On the other hand, the energy spread of a cold field-emission gun (CFEG) is generally lower—typically about 0.3 eV—but CFEGs generally have unsatisfactory emission stability, which tends to make them unsuitable electron sources for many applications. Electron sources with a lower energy spread, which can be practically employed in electron microscopy, for example, do not currently exist. In an attempt to mitigate the effects of energy spread in an electron source, one might contemplate the use of an energy filter (monochromator) or a chromatic aberration corrector, both of which are already known per se (an energy filter fans out an available energy spectrum and then allows only a portion of it to pass through a selector; a corrector uses octupole and/or hexapole lenses, for example, to create a negative-power lens element for use in the charged-particle equivalent of an achromatic doublet). However, such options typically involve the use of rather complicated and expensive equipment, and are thus relatively unattractive. In addition, an energy filter can be relatively wasteful of available electron flux.

It is an object of the invention to mitigate these problems. More specifically, it is an object of the invention to provide a novel electron source with a reduced energy spread. In particular, it is an object of the invention that such a source be suitable for use in an electron microscope or electron-beam lithographic apparatus, for example.

These and other objects are achieved in an electron source according to the invention, characterized in that at least part of the electrode comprises semiconductor material having a conduction band that is quantized into discrete energy levels.

The fundamental approach underlying the invention is to incorporate in/on the electrode a semiconducting material having a set of quantized energy levels for the electrons in the conduction band. Advantageously, these energy levels have a small width (e.g. a Full Width at Half Maximum (FWHM) of the order of a few tens of milli electron volts (meV)) and are mutually separated (in energy) by an interval of at least kT, where k is the Boltzmann constant and T is the absolute temperature of said material (such separation helping to deter population of more than one energy level at ambient temperature, and thus helping to deter scattering and interference effects). When at least some of these levels are populated and (for example) a relatively strong electric field is applied, electron emission (to vacuum) takes place, and an electron beam can be obtained whose energy spread is lower than that of a conventional CFEG.

The inventors have discovered that such a scenario can be achieved under certain conditions in a so-called nanowire, comprised of appropriate semiconductor material. A nanowire is a fragment of crystalline material that generally comprises a limited number of atoms (e.g. of the order of $10^{12}$ atoms). Its diameter is typically of the order of about 10-100 nm, depending on the dimensions of the catalyst (e.g. gold) used in its production; on the other hand, its length can typically be set, as a function of the growth time employed in its production, from a few μm to several hundred μm (though practical nanowires generally have lengths of the order of 10-15 μm). Nanowires can therefore essentially be regarded as one-dimensional crystals, as a result of which they can demonstrate size-dependent quantum effects relevant for the present invention. Growth and subsequent study of nanowires are described, for example, in the article by Duan et al. in Nature 409 (January 2001), pp 66-69 (which does not relate to electron emission sources). Note that the term nanowire should not be confused with the term nanotube, which refers to a hollow elongated structure, and which demonstrates different physical properties; carbon nanotubes are described, for example, in the article by Yenilmez et al. in Applied Physics Letters 80, No. 12 (March 2002), pp 2225-2227.

The quantization effects discussed above thus result in a change of the density of states from a continuum to discrete energy levels. The inventors have discovered that, in a semiconductor nanowire, the energy differences between these levels depend inter alia on the radius of the nanowire and the effective electron mass m* in the wire. For practical purposes (ease of manufacture, handling, and subsequent attachment of the nanowire to a macroscopic electrode) preference is generally given to a relatively large radius; consequently, a relatively small effective electron mass m* is required.

The inventors have performed various studies to determine particularly suitable semiconductor materials for use in the invention. More specifically, the quantization of energy levels in radial direction in nanowires was calculated by solving the Schrödinger equation for a cylinder with radius R and an infinite length, assuming an infinite confining potential. The values of the energy levels are eigenvalues for the energy in the confined plane $\epsilon_{m,n}$, determined by the Planck constant $\hbar$, the effective electron mass m* of the material, and the solution of the m,n$^{th}$ Bessel function $J_{m,n}$:

$$\epsilon_{m,n} = \hbar^2 J^2_{m,n} / 2m^* R^2$$

with the solutions $J_{m,n}$ given by:

TABLE 1

| | (m, n) | | | | |
|---|---|---|---|---|---|
| | (0, 0) | (1, 0) | (2, 0) | (0, 1) | (3, 0) |
| $J_{m, n}$ | 2.4 | 3.8 | 5.1 | 5.5 | 6.4 |

As an example, for an effective mass ratio of 50 and a radius of 20 nm, this model gives an energy of 28 meV for the first level and 70 meV for the second level (see FIG. 3) [the effective mass ratio is the ratio of the mass $m_e$ of a free electron to the effective mass $m^*$ of an electron in the material in question]. The validity of this model was further confirmed by performing numerical calculations taking into account the finite nature of the potential barrier.

In a preferential embodiment of the invention, the discussed semiconductor material comprises a substance selected from the group comprising InAs and GaInAs. In the case of InAs, the inventors have observed a relatively large energy difference $\Delta E$ between the first and second quantized levels. Moreover, InAs has other favorable electronic parameters, such as a relatively high electron mobility and low intrinsic resistivity. In addition, InAs makes Ohmic contact with, for example, a tungsten electrode, and has a relatively small band gap (ca. 0.35 eV); thus, electrons are already in the conduction band when the material is contacted. These favorable properties can be further tuned by the incorporation of (small quantities of) Ga in the InAs. The presence of (for example) about 1-4 at. % Ga in the InAs can also facilitate growth of the nanowire.

The discussed semiconductor material can also be comprised of other substances, such as, for example, GaAs, CdSe, GaN, GaP and InP. Various other III-V and/or II-VI semiconductor substances, for example, are also suitable. The effect of a relatively small value of $\Delta E$ in a nanowire of the chosen substance can, if desired, be mitigated by decreasing the radius R of the nanowire. In the employed material, a small amount of N-doping can have the advantageous effect of reducing field penetration, resulting in so-called band bending and causing electronic population of some of the lower energy levels in the conduction band—an effect that can also be achieved by thermal excitation (e.g. heating with an electrical filament) or photonic excitation (e.g. irradiation with a laser), for example. Too much doping, however, can cause an undesirable increase in the obtained energy spread $\delta E$, by causing higher energy bands to become populated.

The inventors have provided individual semiconductor nanowires of suitable material and dimensions (e.g. of InAs or GaInAs, with a radius R of 20-25 nm and a length L of 10-15 μm) on electrodes (e.g. comprising doped Si, metals such as tungsten or gold, etc.) with a tapered extremity (such as filament tips, which are conventionally used in electron microscopes, AFMs (Atomic Force Microscopes), STMs (Scanning Tunneling Microscopes), etc.), thus producing point electron sources; as an alternative to a filament tip, one could also mount the nanowire on a knife-like edge of an electrode, for example. When such electron sources were tested as regards their emission properties, they were found to have an exceptionally low energy spread $\delta E$ (set forth in more detail in the comparative examples below). In addition, it was observed that they emitted electrons at low turn-on voltages (commensurate with the high aspect ratio of the employed nanowires). If the surfaces of the nanowires were cleaned prior to use (e.g. by heating in vacuum), the emitted current was observed to be stable in time (see FIG. 6, for example). A further advantage is that the emitted electrons were confined to a relatively narrow, round beam (rightmost inset in FIG. 6), which is an attractive property in the case of application in an electron microscope, for example.

As an alternative to mounting a semiconductor nanowire on an electrode with a tapered extremity, one may also consider mounting it on an essentially flat electrode surface. The lower electric field generally achievable in such a scenario may, for example, be compensated by appropriate photonic excitation (e.g. laser pumping) and/or thermal excitation (heating the electrode).

Although the results discussed above were obtained in the case of individual semiconductor nanowires, similar results may be obtained in the case of a bundle of semiconductor nanowires in which one nanowire protrudes outward beyond the others, or in the case of a matrix source in which a relatively large number of semiconductor nanowires are arrayed side-by-side on an electrode (thus giving a significantly greater current/intensity than a single nanowire).

There are various manners in which a semiconductor nanowire for use in the current invention can be provided to an electrode as referred to above. A separately grown nanowire can, for example, be attached to an electrode by manipulating it into place with the aid of an electron (or optical) microscope and a micromanipulator; attachment of the nanowire to the electrode in such a case can then occur via Van de Waals forces, or with the aid of conducting adhesive, e.g. carbon tape. Alternatively, a nanowire can be grown in situ on the electrode in question, in which case the employed catalyst must be present in advance on the electrode. Another alternative is to dip the electrode into a liquid in which nanowires are suspended; in this case, (hydrophobic) nanowires will readily attach themselves to the surface of the electrode (again via Van de Waals forces). When the nanowire is mounted on a tip having a longitudinal axis $Z_{tip}$, the former is preferably oriented so that its own longitudinal axis $Z_{nanowire}$ is substantially parallel to $Z_{tip}$. In repeated trials, the inventors have consistently achieved such parallelism to within about 5-10°. Techniques such as those referred to here are described in various publications in the technical literature, and will be familiar to the skilled artisan.

The invention and its attendant advantages will be further elucidated on the basis of an explanatory example, embodiments and the accompanying schematic drawings, whereby:

FIG. 1 relates to a prior-art scenario, and renders a graph of potential energy $U_{pot}$ as a function of position x through an interface between a metal and a surrounding vacuum environment;

Figure 8:
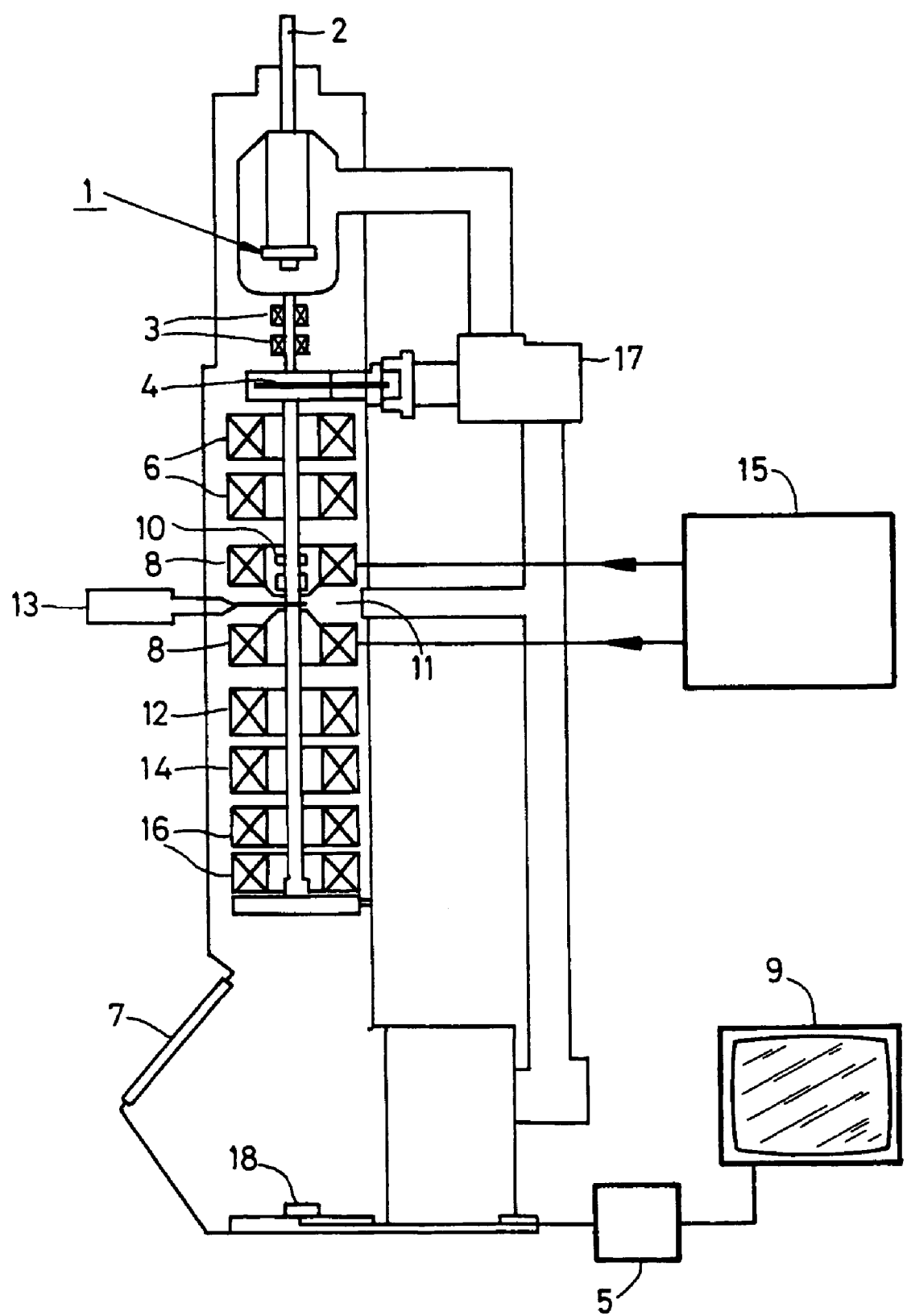
Figure 9A:
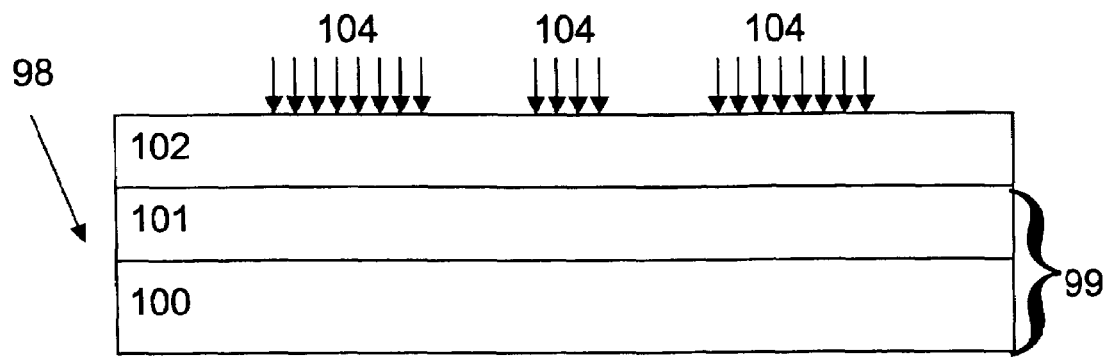
Figure 9B:
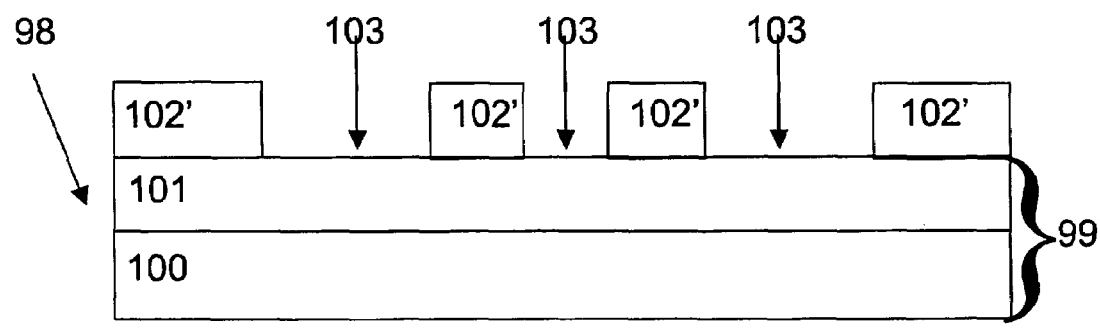
Figure 9C:
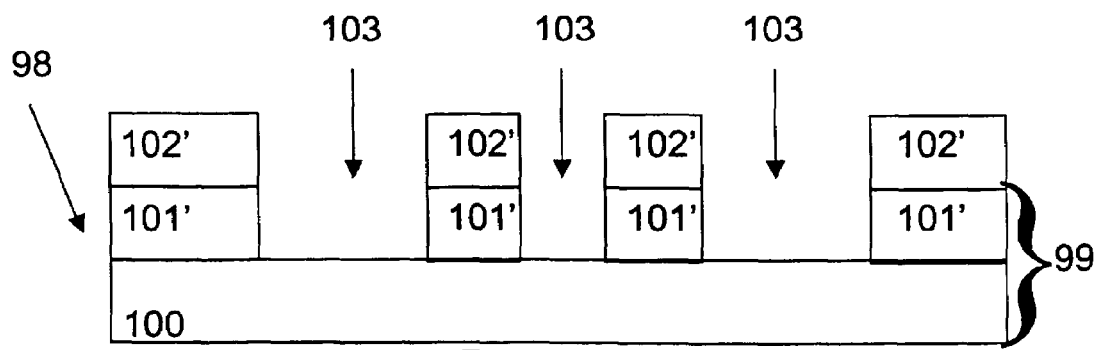

FIG. 8 renders an elevational view of a particle-optical apparatus employing an electron source according to the invention;

FIG. 9 shows a semiconductor wafer illuminated by an electron beam. In the figures, corresponding elements are denoted using corresponding reference symbols.

EXPLANATORY EXAMPLE

Figure 1:
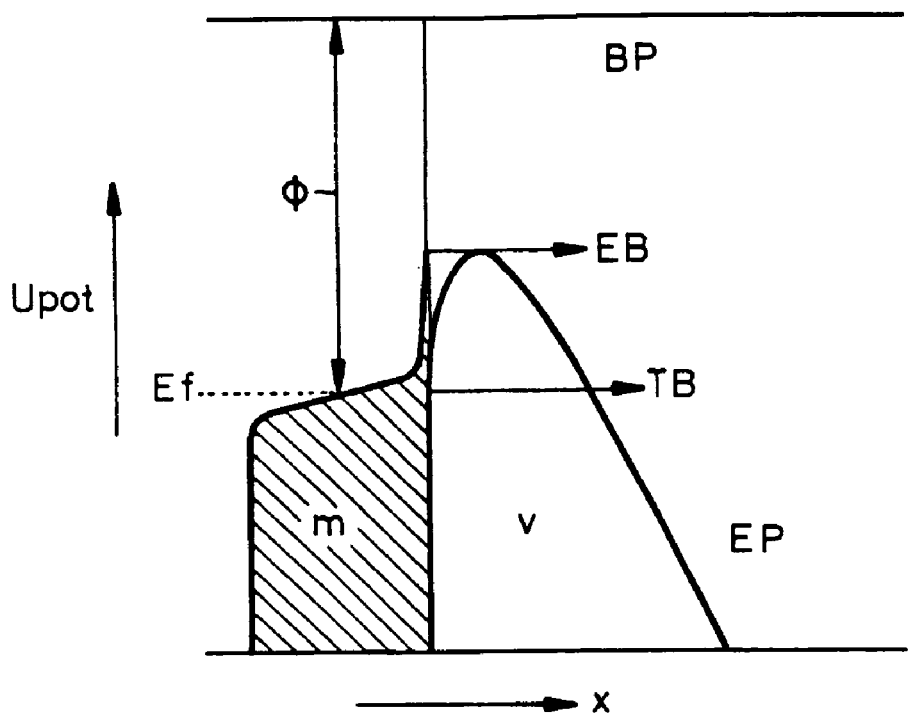

A metal at a temperature of 0 K has a continuum of electronic energy levels, filled up as far as the Fermi level $E_f$. The energy difference between the Fermi level and an electron in vacuum is the so-called work function $\phi$ of the material. When an electric field F is applied at the surface of the metal, the electrons experience a barrier of a certain width with regard to emission into vacuum. For strong fields F (e.g. $3\text{-}7\times10^9$ V/m) this width becomes small enough to allow tunneling of the electrons through the barrier. This situation is depicted in FIG. 1, which is a graph of potential energy $U_{pot}$ as a function of position x through the metal (M)/vacuum (V) interface. In the figure, BP indicates barrier potential, EP indicates the effective potential in the presence of an electric field F, EB represents emission over the barrier, and TB represents tunneling through the barrier.

The required value of F is much larger than can generally be obtained between planar electrodes (in which case there is a practical limit of about $5\times10^7$ V/m, to avoid arc-over). Consequently, an electrode having a tapered extremity, such as an edge or sharp tip, is employed. In the case of such an electrode, field enhancement takes place, and F can be approximated by the relationship $F=V/(5r)$, where V is the extraction voltage and r the radius of curvature of said extremity. So, for example, an emitter tip with r=50 nm requires an extraction voltage of about 1.3 kV to achieve emission.

Figure 2:
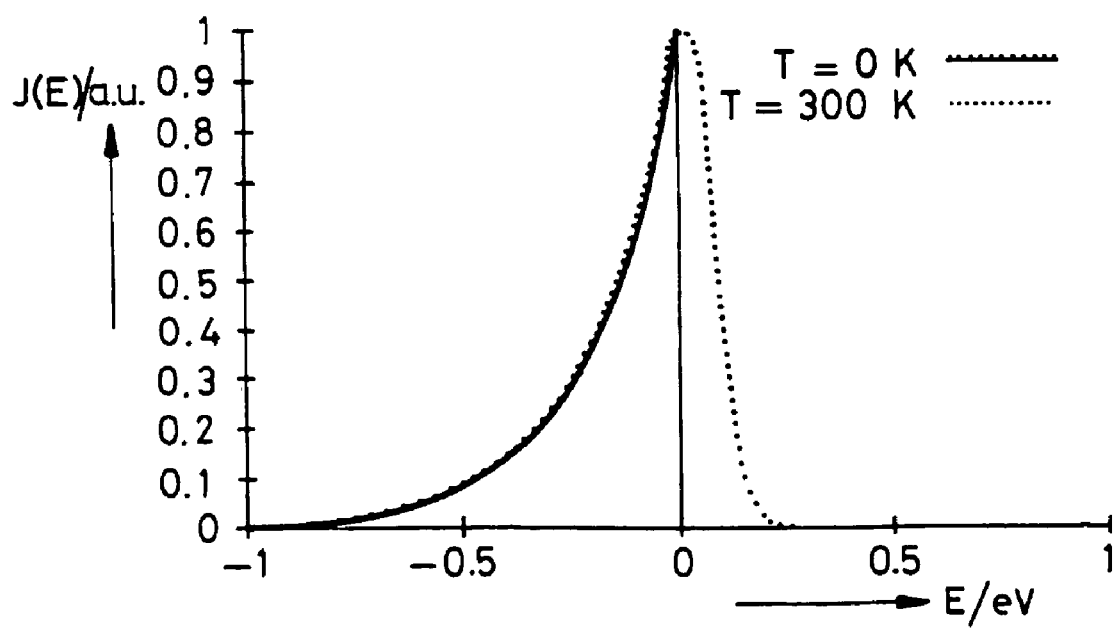
FIG. 2 is a graph of theoretical current density versus energy for electrons emitted into vacuum from the metal to which FIG. 1 pertains, at two different temperatures.

The theoretical energy distribution of the emitted electrons is shown in FIG. 2, in which the horizontal axis represents energy deficit/surplus E (in eV) with respect to the Fermi level $E_f$. Most emitted electrons have an energy $E_f$ (i.e. E=0). The tunneling probability reduces exponentially with decreasing energy and, therefore, the emitted current density J (plotted in arbitrary units (a.u.)) is an exponential function of E—thus explaining the exponential shape of the energy spectrum [solid curve]. At higher temperatures T, energy levels above $E_f$ will also be filled; the resulting energy spectrum in such a case (specifically for T=300 K) is also shown in FIG. 2 [broken curve].

The energy spread in the depicted spectra, as quantified by the Full Width at Half Maximum (FWHM), is of the order of 0.22 eV at T=300 K. In an actual metal, this value will be increased as a result of, for example, Coulomb interactions, and a value approaching 0.3 eV will be obtained.

EMBODIMENT 1

Figure 3:
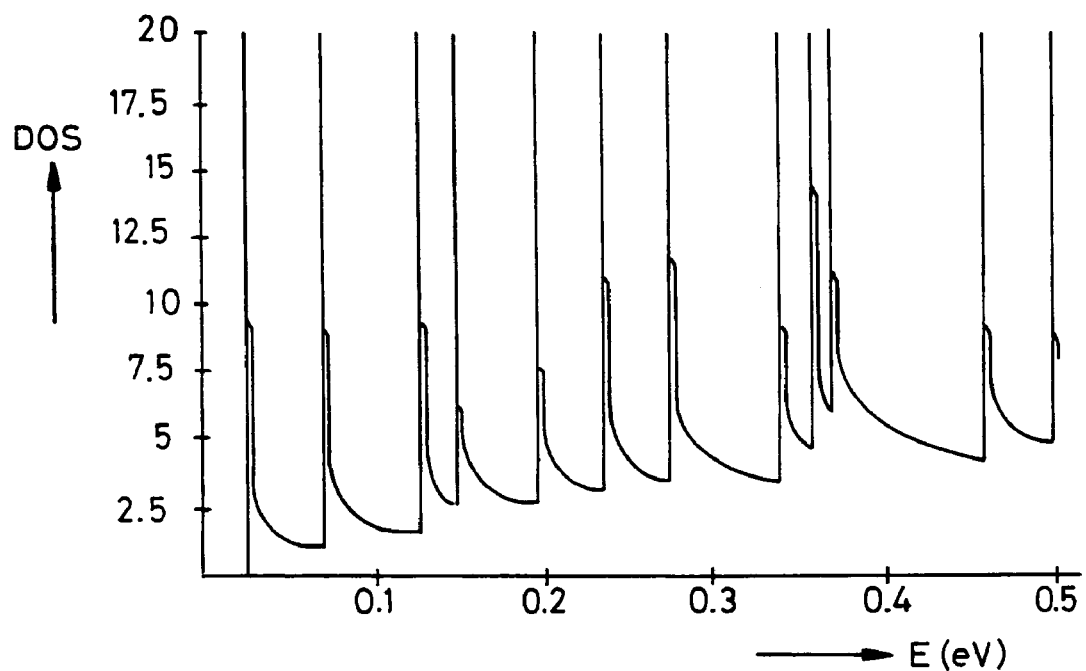
FIG. 3 shows calculated Density of States as a function of energy in the case of a semiconductor nanowire suitable for use in an embodiment of an electron source according to the invention.

The inventors have formulated and solved the Schrödinger equations for semiconductor nanowires in the approximation of an infinite round well potential. An example of the obtained Density Of States (DOS) for a nanowire with a radius of 20 nm and an effective mass ratio of 50 is shown in FIG. 3, in which energy E (eV) is plotted along the horizontal axis. The quantization of the DOS is clearly visible.

EMBODIMENT 2

Figure 4:
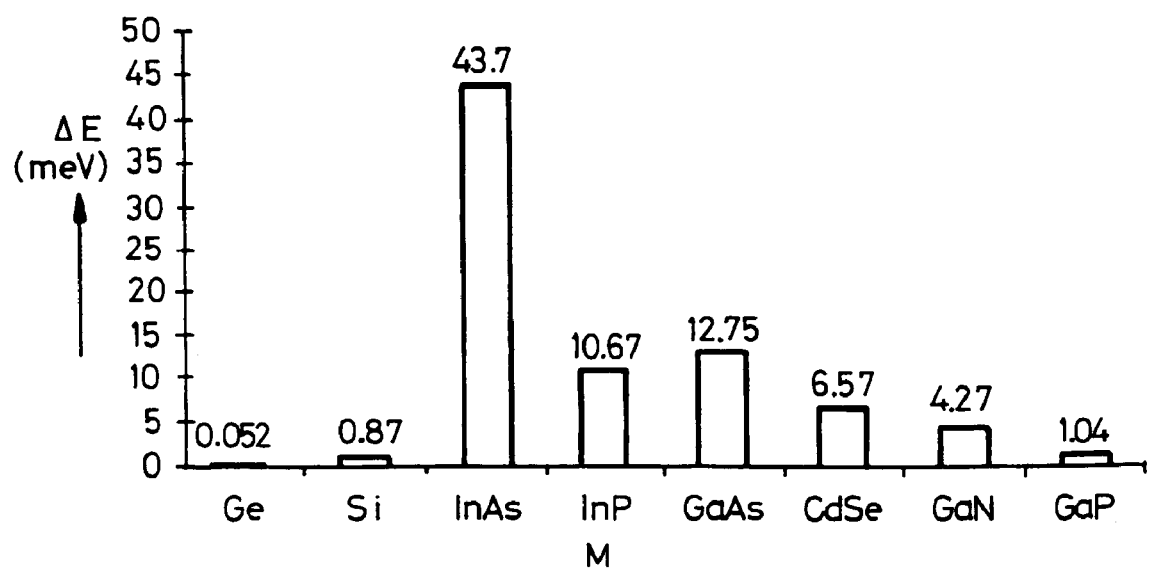
FIG. 4 is a graphical rendition of the energy difference between the first and the second quantized electronic levels in nanowires comprised of different semiconductor materials.

The energy difference $\Delta E$ (in meV) between the first and the second quantized electronic levels for semiconductor nanowires with a radius of 25 nm and comprised of different materials M is shown in FIG. 4. It can be seen that the largest such difference amongst the tested materials is obtained for InAs, though there are various other materials that also exhibit a substantial value of $\Delta E$.

EMBODIMENT 3

The inventors have modeled electron tunneling behavior from an InAs nanowire, calculating how the discrete electronic energy levels in the InAs were filled, and determining the tunneling current as a function of the energy of the emitted electrons. The results of this work are presented in FIG. 5 and Table 2, which pertain to a situation whereby only one level is assumed to be populated.

Figure 5:
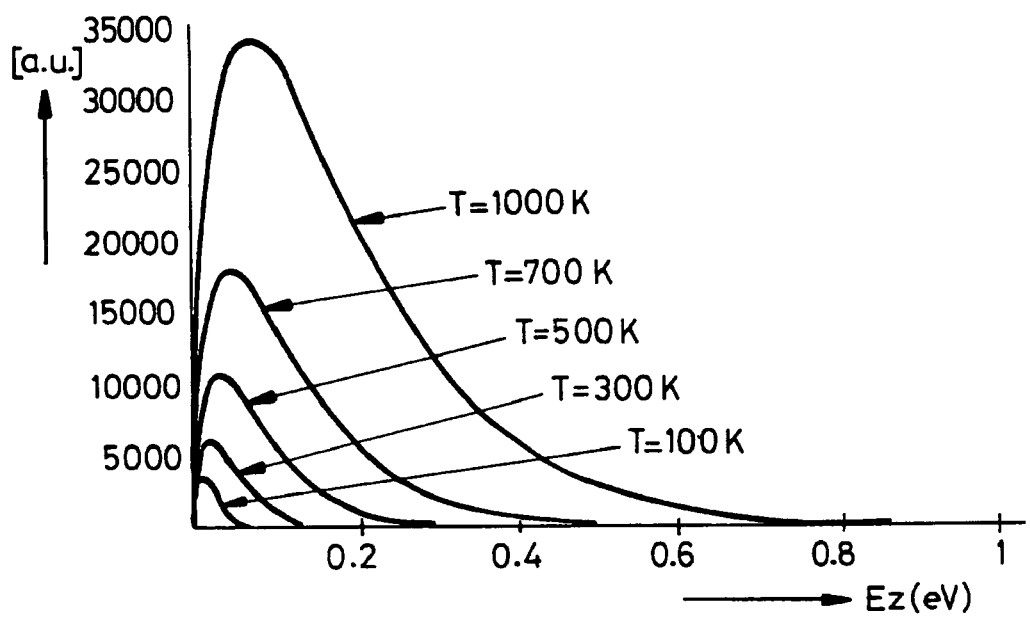
FIG. 5 depicts energy spectra at different temperatures T for an InAs nanowire suitable for use in an embodiment of an electron source according to the invention.

FIG. 5 depicts energy spectra at different temperatures T for an InAs nanowire, at an applied electric field F=5.5 V/nm. The vertical axis is graduated in arbitrary units (a.u.), whereas the horizontal axis represents electron energy (Ez, in eV) measured along the longitudinal (emission) axis of the nanowire. The nanowire radius is R=35 nm, and the Fermi energy is $E_f$=20 meV. Note that, in all spectra, the FWHM is (significantly) less than 0.3 eV (the value typically obtainable with a CFEG).

Table 2 gives values of the FWHM (in meV) at different temperatures T and for two different values of the applied electric field F (in V/nm). Note that all FWHM values are (significantly) less than 0.3 eV (the value typically obtainable with a CFEG).

TABLE 2

| FWHM [meV] | T = 100K | T = 300K | T = 500K | T = 700K | T = 1000K |
|---|---|---|---|---|---|
| F = 3.5 V/nm | 28 | 65 | 113 | 174 | 296 |
| F = 5.5 V/nm | 27 | 62 | 104 | 151 | 235 |

EMBODIMENT 4

Figure 6:
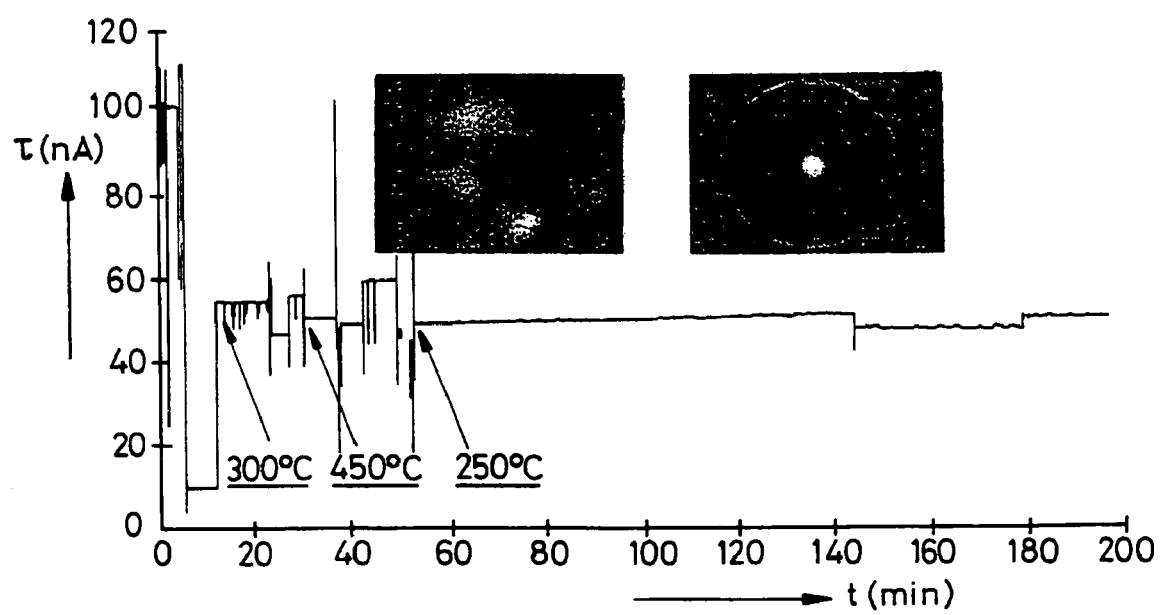
FIG. 6 shows emission behavior from a particular embodiment of an electron source according to the invention.

FIG. 6 shows emission behavior from a particular embodiment of an electron source according to the invention, and plots emission current J (in nA) as a function of elapsed time t (in minutes). The left-hand portion of the figure (up to approx. 55 min. elapsed time) shows rather erratic emission behavior, caused by the presence of an adsorbed layer of molecules on the surface of the employed nanowire (which molecules disturb the tunneling effects exploited by the invention). Treating the nanowire by heating it in vacuum causes the removal of these molecules, after which a more constant emission behavior is observed (middle and right-hand portions of the figure). The effectiveness of this heat treatment is influenced by both its duration and the temperature involved; the values quoted in the left-hand portion of the figure indicate various temperatures at which the inventors conducted observations. Note that the steps visible at around 145 min. and 180 min. were caused by fluctuations in the voltage source supplying electric potential to the employed electrode.

The insets in the figure show emission patterns observed along the longitudinal axis of the employed nanowire. The left inset corresponds to the situation before cleaning, and shows several "hotspots", which shift positionally with time in an erratic fashion. The right inset shows the situation after cleaning, with a single, stable source.

EMBODIMENT 5

The inventors were able to produce semiconductor nanowires suitable for use in an electron source according to the invention using, for example, the following technique. A target was provided comprised of candidate material for the nanowire (such as InAs, InGaAs, GaP, GaAs or InP, for example). This target was doped, if desired.

A substrate was also provided on which to grow the required nanowire, the substrate comprising a metal (such as Au, Ag, Pt, W, etc.) or a semiconductor substance (such as Si, $SiO_2$, InP, InAs, etc.), for example. In the case of a metal, a metal film with a thickness of, for example, 0.2-10 nm was provided on a non-metallic substrate (such as Si).

The target was irradiated with a laser, such as an excimer laser with a wavelength of 193 nm, a pulse frequency of 1-10 Hz, and a pulse energy of 30-200 mJ per pulse. A typical growth session involved the use of 2000-20000 pulses, for example.

Growth was performed in a vacuum chamber first evacuated to ca. $10^{-7}$ mbar pressure and then provided with ca. 100-200 mbar Ar as a background gas (if desired, also containing $H_2$, to mitigate oxidation). The background gas was caused to flow through the chamber at ca. 100-300 sccm/s. The chamber temperature was kept at a value in the range 600-900° C., and the substrate temperature at a value in the range 400-800° C.

EMBODIMENT 6

Figure 7:
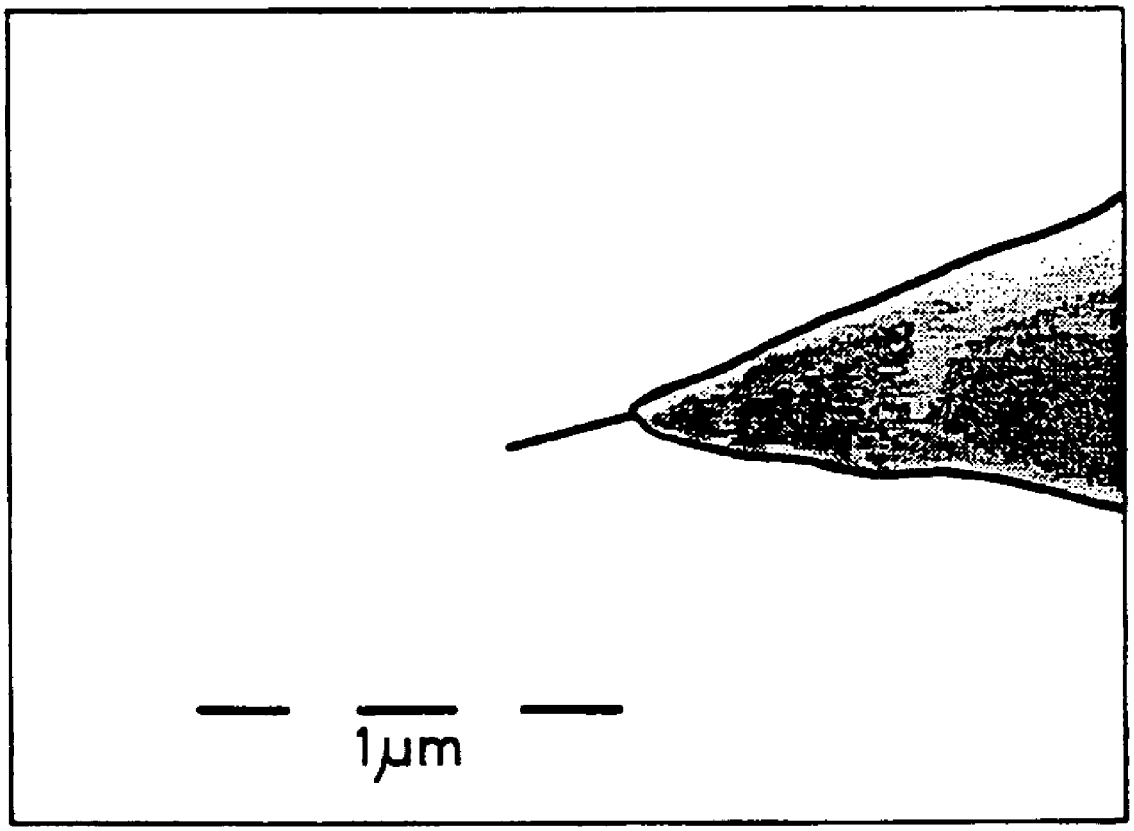
FIG. 7 is a SEM photograph of part of an electron source according to a particular embodiment of the current invention.

FIG. 7 is a SEM photograph of part of an electron source according to a particular embodiment of the present invention. The photograph shows a substantially conical, point-shaped, tungsten tip electrode (on the right) to whose extremity an N-doped InAs nanowire has been Ohmically attached (center). The radius of the depicted nanowire is of the order of 30 nm, and its length is of the order of 2 μm (of which only a portion protrudes beyond the tip electrode). When an electric potential of ca. 1.5 kV is applied to the tungsten electrode (at a temperature of 300K), electron emission with a very low energy spread δE occurs from the protruding extremity of the nanowire (i.e. remote from the tungsten tip).

EMBODIMENT 7

FIG. 8 shows a particle-optical apparatus in the form of an electron microscope. The apparatus includes an electron source 1, a beam alignment system 3 and a beam diaphragm 4, a condenser lens 6, an objective lens 8, a beam scanning system 10, an object space 11 with a specimen holder 13, a diffraction lens 12, an intermediate lens 14, a projection lens 16 and an electron detector 18. The objective lens 8, the intermediate lens 14 and the projection lens 16 together constitute an imaging lens system. These elements are accommodated in a housing provided with an electric supply lead 2 for the electron source, a viewing window 7 and a vacuum pumping device 17. The energizing coils for the objective lens 8 are connected to a control unit 15 that is arranged to control the energizing of the imaging lens system. The electron microscope also includes a recording unit with the electron detector 18, an image processing unit 5 and a video display 9 for observing the images formed.

The particular apparatus depicted in FIG. 8 is a TEM. A typical accelerative voltage for a TEM is 300 kV, whereas a typical accelerative voltage for a SEM is 30 kV. This higher accelerative voltage for a TEM is necessary so as ensure that electrons in the electron beam are at least partially irradiated through the object to be investigated. To this end, it is also necessary that an object to be investigated using a TEM have a certain maximal thickness, which is normally around 100 nm. A hybrid alternative to a SEM or TEM is a Transmissive Scanning Electron Microscope (TSEM), in which, in a SEM environment (characterized by a relatively low accelerative voltage), an electron detection plate is provided under a sample on specimen holder 13, which plate allows an image of the sample to be obtained. In this scenario, use is made of the fact that the degree of deflection suffered by an electron during irradiation through a sample is dependent on the mass of the elements that an electron passes during the irradiation. The contrast mechanism thus created generates the image of the sample.

The apparatus in FIG. 8 employs an electron source 1 according to the current invention, for example as described above in Embodiment 6.

EMBODIMENT 8

FIG. 9 shows a semiconductor wafer illuminated by an electron beam. In the method for manufacturing a device 98 one or more electron sources according to the invention are used in an e-beam lithographic apparatus. The device may be an electric device such as an integrated circuit or a liquid crystal display device.

In an embodiment of the method a substrate 99 such as a semiconductor wafer 100, e.g. a monocrystalline silicon wafer, a silicon on insulator wafer or a GaAs wafer is provided. The substrate 99 may be a pre-fabricated integrated circuit and may comprise patterned and/or unpatterned layers 101 of other materials such as insulators, e.g. silicon dioxide, or electrical conductors, e.g. copper. The substrate 99 has a resist layer 102 having a solubility, which is alterable by electron bombardment. Any resist layer used for e-beam lithography may be used. The resist layer 102 is bombarded by electrons 104 extracted from an electron source according to the invention. Using an e-beam lithographic apparatus, which may have several electron sources according to the invention operated in parallel, the solubility of the resist layer 102 is locally altered. Subsequently, the resist layer thus obtained is developed thereby exposing a part 103 of the substrate 99 while a remainder of the substrate 99 remains being covered by a remainder 102' of the resist layer 102. The patterned resist layer 102' thus obtained is used as a mask in a material removal process such as a wet or a dry etching process, i.e. material of the substrate 99 exposed by the mask 102' is removed. In this way the substrate 99 is patterned. In case the substrate comprises two or more layers the upper layer 101 only, i.e. the layer close to the resist layer may be patterned in this way, resulting in a patterned layer 101'. To this end a selective etching method may be used.

The invention claimed is:

1. An electron source suitable for use in a charged-particle apparatus, in which source a beam of electrons can be extracted from an electrode that is subjected to at least one of an electric potential, thermal excitation and photonic excitation, characterized in that at least part of the electrode comprises semiconductor material having a conduction band that is quantized into discrete energy levels.

2. An electron source according to claim 1, wherein the energy levels are mutually separated by an interval of at least kT, where k is the Boltzmann constant and T is the absolute temperature of said material.

3. An electron source according to claim 1 characterized in that the electrode comprises at least one nanowire that is comprised of semiconductor material and that is attached to a macroscopic support.

4. An electron source according to claim 3, wherein the nanowire forms an Ohmic contact with the support.

5. An electron source according to claim 3, wherein said semiconductor material comprises a substance selected from the group consisting of InAs and GaInAs.

6. An electron source according to any of claim 3, wherein said semiconductor material is N-doped.

7. An electron source according to claim 3, wherein the electrode comprises a portion having a tapered extremity and said semiconductor material is provided at said extremity.

8. A particle-optical apparatus comprising an electron source, a holder for an object, and means for directing an electron beam from the electron source onto the object, characterized in that the electron source is a source according to claim 3.

9. A particle-optical apparatus according to claim 8, characterized in that the apparatus is selected from the group consisting of a scanning electron microscope, transmission electron microscope, transmission scanning electron microscope, scanning transmission electron microscope, and e-beam lithographic apparatus.

10. Method for manufacturing a device comprising the steps of:
providing a substrate being coated by a resist layer having a solubility which is alterable by electron bombardment,
bombarding the resist layer by electrons from an electron source,
developing the resist layer after the step of bombarding thereby exposing apart of the substrate while a remainder of the substrate remains being covered by a remainder of the resist layer, and subjecting the exposed parts of the substrate to a material removal treatment while the remainder of the resist layer serves as a mask characterized in that
the electron source is of a type as claimed in claim 3.

11. An electron source according to claim 1, wherein said semiconductor material comprises a substance selected from the group consisting of InAs and GaInAs.

12. An electron source according to any of claim 1, wherein said semiconductor material is N-doped.

13. An electron source according to claim 1, wherein the electrode comprises a portion having a tapered extremity and said semiconductor material is provided at said extremity.

14. A particle-optical apparatus comprising an electron source, a holder for an object and means for directing an electron beam from the electron source onto the object, characterized in that the electron source is a source according to claim 1.

15. A particle-optical apparatus according to claim 14, wherein, in addition to said electron beam, the apparatus comprises means for producing at least one other charged-particle beam.

16. A particle-optical apparatus according to claim 14, characterized in tat the apparatus is selected from the group consisting of a scanning electron microscope, transmission electron microscope, transmission scanning electron microscope, scanning transmission electron microscope, and e-beam lithographic apparatus.

17. Method for manufacturing a device comprising the steps of:
providing a substrate being coated by a resist layer having a solubility which is alterable by electron bombardment,
bombarding the resist layer by electrons from an electron source,
developing the resist layer after the step of bombarding thereby exposing a part of the substrate while a remainder of the substrate remains being covered by a remainder of the resist layer, and subjecting the exposed parts of the substrate to a material removal treatment while the remainder of the resist layer serves as a mask characterized in that
the electron source is of a type as claimed in claim 1.

18. An electron source suitable for use in a charged-particle apparatus, in which source a beam of electrons can be extracted from an electrode that is subjected to at least one of an electric potential, thermal excitation and photonic excitation, characterized in that said source comprises a semiconductor material capable of emitting an electron beam in which the energy spread is at most 0.2 eV at a temperature of 300 K.

19. An electron source according to claim 18, wherein said semiconductor material comprises a substance selected from the group consisting of InAs and GaInAs.

20. An electron source according to any of claim 18, wherein said semiconductor material is N-doped.

21. An electron source according to claim 18, wherein the electrode comprises a portion having a tapered extremity and said semiconductor material is provided at said extremity.

22. A particle-optical apparatus comprising an electron source, a holder for an object, and means for directing an electron beam from the electron source onto the object, characterized in that the electron source is a source according to claim 18.

23. A particle-optical apparatus according to claim 22, characterized in that the apparatus is selected from the group consisting of a scanning electron microscope, transmission electron microscope, transmission scanning electron microscope, scanning transmission electron microscope, and e-beam lithographic apparatus.

24. Method for manufacturing a device comprising the steps of:
providing a substrate being coated by a resist layer having a solubility which is alterable by electron bombardment,
bombarding the resist layer by electrons from an electron source,
developing the resist layer after the step of bombarding thereby exposing a part of the substrate while a remainder of the substrate remains being covered by a remainder of the resist layer, and subjecting the exposed parts of the substrate to a material removal treatment while the a remainder of the resist layer serves as a mask characterized in that
the electron source is of a type as claimed in claim 18.

* * * * *